US009638729B2

United States Patent
Maekawa et al.

(10) Patent No.: US 9,638,729 B2
(45) Date of Patent: May 2, 2017

(54) ANALYSIS APPARATUS AND ANALYSIS METHOD

(71) Applicant: Lasertec Corporation, Yokohama, Kanagawa (JP)

(72) Inventors: Hiroyuki Maekawa, Kanagawa (JP);
Yoshihiro Nishimura, Kanagawa (JP);
Seiji Morishita, Kanagawa (JP);
Hisahiro Yamaoka, Kanagawa (JP);
Takumi Hirakawa, Kanagawa (JP);
Makoto Yonezawa, Kanagawa (JP)

(73) Assignee: LASERTEC CORPORATION, Yokohama, Kanagawa (JP)

( * ) Notice: Subject to any disclaimer, the term of this patent is extended or adjusted under 35 U.S.C. 154(b) by 771 days.

(21) Appl. No.: 14/076,973

(22) Filed: Nov. 11, 2013

(65) Prior Publication Data

US 2014/0136132 A1    May 15, 2014

(30) Foreign Application Priority Data

Nov. 14, 2012   (JP) .................................. 2012-250592

(51) Int. Cl.
*G01R 21/00*  (2006.01)
*H01M 10/04*  (2006.01)
(Continued)

(52) U.S. Cl.
CPC ........ *G01R 21/006* (2013.01); *H01M 10/052* (2013.01); *H01M 10/054* (2013.01);
(Continued)

(58) Field of Classification Search
CPC ............. G01R 21/006; G01R 31/3634; H01M 10/052; H01M 10/44; H01M 10/488; H01M 10/054; Y02T 10/7011; Y02E 60/122

See application file for complete search history.

(56) References Cited

U.S. PATENT DOCUMENTS 5,132,176 A * 7/1992 Valentine ............ H01M 10/484
429/54
5,756,232 A * 5/1998 Kelly ...................... H01M 4/13
429/232
(Continued)

FOREIGN PATENT DOCUMENTS

JP    2001-110419    4/2001
JP    2003-257503    9/2003
(Continued)

OTHER PUBLICATIONS

Mickael Dolle et al. ("Live Scanning Electron Microscope Observations of Dendritic Growth in Lithium/Polymer Cells", Electrochemical and Solid-State Letters, 5 (12), 2002, pp. 286-289.*
(Continued)

*Primary Examiner* — Alexander Satanovsky
(74) *Attorney, Agent, or Firm* — Procopio, Cory, Hargreaves & Savitch LLP

(57) ABSTRACT

Provided are an analysis apparatus and an analysis method which are capable of recognizing a local state change of an internal structure of a secondary battery. The analysis apparatus includes: an observation cell that houses a secondary battery; a charging and discharging controller that controls charging and discharging of the secondary battery; an image pickup device that captures color images of the secondary battery at a predetermined time interval; and a charging and discharging data detection unit that acquires charging and discharging data on the secondary battery during charging and discharging. Color image signals output from the image pickup device and charging and discharging data signals output from the charging and discharging data detection unit are supplied to a signal processing device. The signal processing device outputs a unit that temporally links time- (Continued)

series color image signals and time-series charging and discharging data signals, and designated analysis data.

9 Claims, 9 Drawing Sheets
(4 of 9 Drawing Sheet(s) Filed in Color)

(51) Int. Cl.
H01M 10/054 (2010.01)
H01M 10/44 (2006.01)
H01M 10/48 (2006.01)
G01R 31/36 (2006.01)
H01M 10/052 (2010.01)

(52) U.S. Cl.
CPC ......... *H01M 10/44* (2013.01); *H01M 10/488* (2013.01); *G01R 31/3634* (2013.01); *Y02T 10/7011* (2013.01)

(56) References Cited

U.S. PATENT DOCUMENTS

| 2005/0012989 A1* | 1/2005 | Kei ................. G02B 21/0024 359/368 |
| 2009/0096459 A1 | 4/2009 | Yoneda et al. |
| 2009/0173898 A1* | 7/2009 | Kitahara ............ G02B 21/0032 250/578.1 |
| 2012/0226455 A1 | 9/2012 | Kumashiro et al. |

FOREIGN PATENT DOCUMENTS

| JP | 4823212 B | 9/2005 |
| JP | 5055292 B | 5/2007 |
| JP | 2009-097878 | 5/2009 |
| JP | 2010-0019813 A | 1/2010 |
| JP | 2012-181976 | 9/2012 |
| KR | 10-1998-0023637 | 10/1999 |

OTHER PUBLICATIONS

Korean Patent Application No. 10-2013-0125230; Office Action mailed on Oct. 28, 2014.
Japanese Patent Application No. 2012-250592; Office Action mailed on Jun. 4, 2013.
Lasertec, For Manufacturing of Energy-Efficient Products, ECCS B310, [online] URL: http://www.lasertec.co.jp/en/products/environment/battery/eccsb310.html.

* cited by examiner

OMNIFOCAL IMAGE

ANALYSIS APPARATUS AND ANALYSIS METHOD

CROSS-REFERENCE TO RELATED APPLICATION(S)

This application claims the benefit of Japanese Patent Application No. 2012-250592, filed Nov. 14, 2012, the disclosure of which is hereby incorporated by reference in its entirety.

INCORPORATION BY REFERENCE

This application is based upon and claims the benefit of priority from Japanese patent application No. 2012-250592, filed on Nov. 14, 2012, the disclosure of which is incorporated herein in its entirety by reference.

BACKGROUND OF THE INVENTION

1. Field of the Invention

The present invention relates to an analysis apparatus and an analysis method for analyzing a secondary battery during charging and discharging.

2. Description of Related Art

Lithium ion secondary batteries are used as power supply devices for electric vehicles, mobile terminals, and the like. Research and development for secondary batteries have been rapidly progressed. In the development of secondary battery products, it is a challenge to achieve an increase in capacity of secondary batteries and an improvement in performance, such as high-rate charging and discharging, so as to apply secondary batteries to electricity storage systems for electric vehicles and the like.

As a method of evaluating the performance of a secondary battery, a change in battery voltage during the cycle of charging and discharging is detected and the amount of electricity stored in the battery is detected, to thereby evaluate the performance based on these characteristic curves. For example, a method is known in which a change dV in voltage value and a change dQ in quantity of charged electricity are obtained using a charged electricity quantity Q and a battery voltage V of a secondary battery and an abnormal state of charge is detected from a Q-dV/dQ curve (for example, see Japanese Unexamined Patent Application Publication No. 2012-181976).

As another evaluation method, a method of evaluation based on an AC impedance is known (for example, see Japanese Unexamined Patent Application Publication No. 2009-97878). In such a known evaluation method, frequency characteristics of an internal impedance of a secondary battery are measured by an AC impedance method. Then, optimal values of parameters of components are determined so that the frequency characteristics of the internal impedance match the frequency characteristics of an impedance model including an equivalent circuit representing an electrochemical impedance of a positive electrode and a negative electrode.

As further another evaluation method, an evaluation method using X-ray diffractometry is known (for example, see Japanese Unexamined Patent Application Publication No. 2001-110419). In this evaluation method, powder X-ray diffraction measurement is performed on each cathode active material in an uncharged state. Cathode active materials having a value of a half-value width of a diffraction peak on a (003) lattice plane in the range from 0.095° to 0.130° are determined as non-defective products.

Since the evaluation method based on a charging and discharging curve and the evaluation method using an AC impedance as described above are electrical methods, output information is an average characteristic of the entire battery. Accordingly, these methods have a drawback that the non-uniformity of electrochemical reaction within the battery and the local reaction rate distribution cannot be evaluated. Furthermore, the evaluation method using the X-ray diffraction requires a device for producing powerful X-rays, resulting in the disadvantage of an increase in the size of an evaluation device.

On the other hand, in the development of secondary batteries, if a change with time of the internal structure of each battery, specifically, a change with time of active materials, can be observed from the outside as image information, it is expected to acquire useful development data. For example, the color and shape of cathode and anode active materials are assumed to change depending on the state of charge and the concentration of Li ions. Accordingly, if changes in color, shape, and size of the active materials can be recognized from the outside, the distribution state of Li in the cathode active material and the distribution state of Li in the anode active material layer can be recognized. Thus, it is expected to collect data useful for the development of new battery materials.

Further, by using image data, an image distribution within a second battery can be observed. Thus, there is an advantage of being able to observe a local change in a wide area. Furthermore, if data representing the charging and discharging characteristic and the color image characteristic of each secondary battery, which are temporally linked to each other, can be acquired, analysis data in which the electrical characteristic and the image characteristic are linked to each other can be acquired. This makes it possible to carry out a more useful data analysis.

It is an object of the present invention to provide an analysis apparatus and an analysis method which are capable of outputting various types of analysis data on a secondary battery.

SUMMARY OF THE INVENTION

An observation apparatus according to a first exemplary aspect of the present invention is an analysis apparatus that analyzes a state change during charging and discharging of a secondary battery by using a color image. The analysis apparatus includes: an observation cell that includes an observation window and houses the secondary battery; a charging and discharging controller that controls charging and discharging of the secondary battery housed in the observation cell; a color image pickup device that projects illumination light toward the secondary battery through the observation window, captures a color image of an active material layer of the secondary battery, and outputs time-series color image data; and a signal processing device includes an output unit that outputs, as analysis data, color image data in a moving image format, or two-dimensional color image data associated with an elapsed time of charging and discharging.

An observation apparatus according to a second exemplary aspect of the present invention is an analysis apparatus that analyzes a state change during charging and discharging of a secondary battery by using a color image. The analysis apparatus includes: an observation cell that includes an observation window and houses the secondary battery; a charging and discharging controller that controls charging and discharging of the secondary battery housed in the observation cell; a color image pickup device that projects illumination light toward the secondary battery through the observation window, captures a color image of an active material layer of the secondary battery, and outputs time-series color image data; a charging and discharging data detection unit that acquires charging and discharging data on the secondary battery during charging and discharging, and outputs time-series charging and discharging data; and a signal processing device including: a unit that receives the color image data output from the color image pickup device and the charging and discharging data output from the charging and discharging data detection unit, and temporally links the time-series color image data and the time-series charging and discharging data; and an output unit that outputs analysis data linking the color image data and an electrical characteristic of the secondary battery.

An observation apparatus according to a third exemplary aspect of the present invention is an analysis apparatus that analyzes a state change during charging and discharging of a secondary battery by using a color image. The analysis apparatus includes: an observation cell that includes an observation window and houses a secondary battery to be analyzed; a charging and discharging controller that controls charging and discharging of the secondary battery; a color image pickup device that projects illumination light toward the secondary battery disposed in the observation cell through the observation window, captures a color image of an active material layer of the secondary battery, and outputs time-series color image data; a charging and discharging data detection unit that acquires charging and discharging data on the secondary battery during charging and discharging, and outputs time-series charging and discharging data; and a signal processing device including: a unit that receives the color image data output from the color image pickup device and the charging and discharging data output from the charging and discharging data detection unit, and temporally links the time-series color image data and the time-series charging and discharging data; a conversion unit that converts the color image into a state-of-charge distribution or a charge level distribution indicative of a quantity of electricity intercalated in an active material of the secondary battery by using reference data representing a correspondence between a color of the active material and a state of charge; and a n output unit that outputs, as analysis data, the converted state-of-charge distribution or charge level distribution.

An observation method according to a fourth exemplary aspect of the present invention is an analysis method that analysis a state change during charging and discharging of a secondary battery by using a color image. The analysis method includes: charging and discharging a secondary battery to be analyzed under a predetermined condition by using a charging and discharging controller; capturing a color image of an active material layer of the secondary battery during charging and discharging and forming time-series color image data by using a color image pickup device; and outputting, as analysis data, color image data in a moving image format, or two-dimensional color image data associated with an elapsed time of charging and discharging.

An observation method according to a fifth exemplary aspect of the present invention is an analysis method that analyzes a state change during charging and discharging of a secondary battery by using a color image. The analysis method includes: charging and discharging a secondary battery to be analyzed under a predetermined condition by using a charging and discharging controller; capturing a color image of an active material layer of the secondary battery during charging and discharging and forming time-series color image data by using a color image pickup device; detecting charging and discharging data on the secondary battery during charging and discharging and forming time-series charging and discharging data by using a charging and discharging data detection unit; temporally linking the time-series color image data output from the color image pickup device and the time-series charging and discharging data output from the charging and discharging data detection unit, and forming each of the color image data and the charging and discharging data, the color image data and the charging and discharging data being temporally linked; and outputting analysis data linking the color image data and an electrical characteristic of the secondary battery.

An observation method according to a sixth exemplary aspect of the present invention is an analysis method that analyzes a state change during charging and discharging of a secondary battery by using a color image. The analysis method includes: charging and discharging a secondary battery under a predetermined condition; capturing a color image of an active material layer of the secondary battery during charging and discharging and forming time-series color image data; detecting charging and discharging data on the secondary battery during charging and discharging and forming time-series charging and discharging data; temporally linking the time-series color image data and the time-series charging and discharging data; converting the color image into a state-of-charge distribution or a charge level distribution indicative of a quantity of electricity intercalated in an active material of the secondary battery, by using reference data representing a correspondence between a color of the active material and a state of charge; and outputting the converted state-of-charge distribution or charge level distribution as analysis data.

According to the present invention, it is possible to output various types of analysis data on a secondary battery.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF THE EXEMPLARY EMBODIMENTS

Figure 1A:
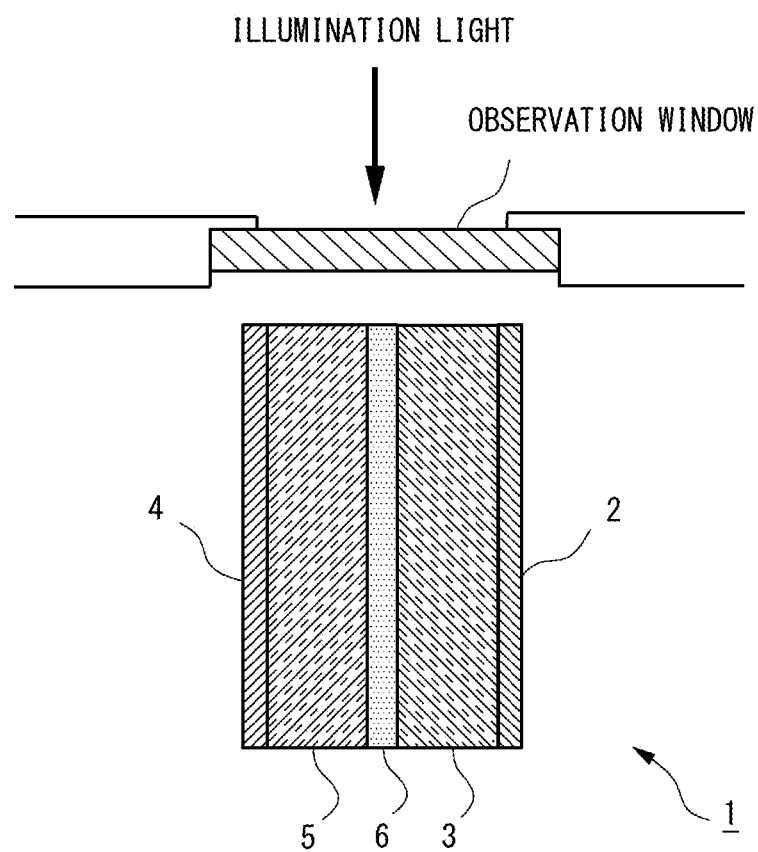
FIG. 1A is a diagrammatic sectional view showing an exemplary configuration of a secondary battery.

An analysis apparatus according to the present invention is an analysis apparatus that analyzes a state change during charging and discharging of a secondary battery and includes: an observation cell that includes an observation window and houses the secondary battery; a charging and discharging controller that controls charging and discharging of the secondary battery; a color image pickup device that projects illumination light toward the secondary battery disposed in the observation cell, captures an image of the secondary battery at a predetermined time interval, and outputs time-series color image data; and a signal processing device including: a unit that receives image signals output from the image pickup device and charging and discharging data signals output from the charging and discharging data detection unit and temporally links the time-series color image signals and the time-series charging and discharging data signals; and an output unit that outputs analysis data designated based on the image signals and the charging and discharging data signals which are temporally linked.

The present inventors have conducted various experiments and analyses on a change in color of graphite, which is an anode active material of a lithium ion secondary battery, during charging and discharging. As a result, it has turned out that the color of graphite changes in such a manner that gray→turquoise→blue→red→gold, depending on a charging time or a quantity of charged electricity. According to this experimental result, a color image clearly shows the state of each area in a wide image pickup area. Accordingly, analysis data on a local change within a battery, such as a rate distribution of electrochemical reaction caused in the secondary battery, can be acquired by associating the color image of the secondary battery with the electrical characteristics. For this reason, in the present invention, the color image signals output from the color image pickup device and the charging and discharging data signals (charging and discharging curve) output from the charging and discharging data detection unit are temporally linked. Then, the color images and the charging and discharging data, which are temporally linked, are formed. In this manner, the image data and the electrical data are temporally linked. This configuration enables output of analysis data linking the electrical characteristics of the entire secondary battery and the local image characteristics obtained from the image data. Moreover, various types of analysis data, such as the relationship between the generation and growth of dendrite and the state of charge, and a reaction rate distribution of electrochemical reaction, can be acquired.

In a preferred embodiment of the analysis apparatus according to the present invention, the signal processing device includes a clock device and first and second memories. The first memory stores, as a pair, the time-series color image signals, which are formed at the predetermined time interval, and time information output from the clock device. The second memory stores, as a pair, the time-series charging and discharging data and time information output from the clock device. In this embodiment, as a unit that links the image data and the charging and discharging data, a clock signal output from the clock device is used as a common clock signal. A set of the common clock signal, the image data, and the charging and discharging data is stored in a memory.

In a preferred embodiment of the analysis apparatus according to the present invention, the charging and discharging data detection unit includes a unit that detects a charging and discharging voltage generated across the secondary battery due to charging and discharging; and a unit that detects a charging and discharging current flowing through the secondary battery. The signal processing device includes a unit that calculates time-series states of charge (S.O.C.) based on the input charging and discharging current. The signal processing device stores, as a pair, the calculated state of charge and the time information into a third memory. The signal processing device outputs the states of charge temporally linked to color image signals. The electrical characteristic data on the secondary battery includes a charging and discharging voltage (battery voltage), which is detected during charging and discharging, and a state of charge. Assuming that a fully charged state is 100%, the state of charge is an index representing a ratio of the quantity of electricity accumulated in the battery to the fully charged state. Thus, the state of charge is extremely useful information as an index representing electrical characteristics of a battery. According to the present invention, the color image signals and the charging and discharging data signals are temporally linked. Accordingly, an integrated current amount is obtained from an amount of current flowing through the secondary battery, thereby calculating the state of charge temporally linked to the color image. Therefore, the use of the color image and the state of charge, which are temporally linked, enables output of various types of analysis data in which the color image data and the electrical data are temporally correlated.

Further, charging is performed at a sufficiently moderate rate by use of a half-cell lithium ion battery. In an experiment using this rate, charging is performed at a rate at which it is considered that a sufficiently equilibrium state is obtained. According to this experimental result, it has turned out that the color of graphite, which is an anode active material, changes uniformly as a whole, and that a change in hue of the active material corresponds to an inflection point of a charging voltage. Accordingly, the state of charge obtained from the integrated current amount of the detected charging and discharging current can be assumed to represent the actual quantity of charged electricity of the active material. The color of the active material is assumed to correspond to the quantity of charged electricity, i.e., the state of charge. Further, the relationship between the color of the active material and the state of charge in the equilibrium state can also be applied to a non-equilibrium state. The non-equilibrium state indicates a state in which charging is performed at a rapid rate at which a time difference occurs between the state of charge, which is calculated from the detected charging and discharging data, and the actual quantity of charged electricity.

In another preferred embodiment of the analysis apparatus according to the present invention, a color confocal image pickup device that captures a color confocal image of the secondary battery while changing a relative distance between the objective lens and the secondary battery, the image of which is to be captured, is used as the color image pickup device. The signal processing device includes a unit that forms, from a color confocal image signal, a color omnifocal image in focus over substantially an entire image pickup area. The signal processing device sequentially stores, as a pair, the color omnifocal image and the time information into the first memory. In the present invention, data on a rate distribution of electrochemical reaction and the like is acquired from the color image of the secondary battery. Accordingly, there is a need to capture an image in focus over substantially an entire image pickup field. In this case, it is difficult for a normal microscope, which captures an image in focus on a part of the image pickup field, to acquire accurate analysis data over the entire visual field. On the other hand, the image pickup device using a confocal optical system captures an image in focus on substantially the entire image pickup field. Therefore, accurate image analysis in a wide visual field can be performed.

In another preferred embodiment of the analysis apparatus according to the present invention, the color confocal image pickup device includes a distance sensor that detects a relative distance in an optical axis direction between the objective lens and the secondary battery. Further, the signal processing device includes a three-dimensional image forming unit that sequentially forms, at a predetermined time interval, three-dimensional images of the surface of the secondary battery by using the input relative distance information and color confocal image signal. The signal processing device further includes a fourth memory, and stores, as a pair, the time-series three-dimensional images and the time information output from the clock device into the fourth memory. The confocal image pickup device can form an omnifocal image in focus on the entire image pickup field, and can also form a three-dimensional image. Capturing three-dimensional images of the surface of the secondary battery during charging and discharging enables detection of the size and the like of the generated dendrite when dendrite is deposited on the surface of the battery. It is also possible to recognize a growth state in a three-dimensional direction of dendrite. Particularly, a section image in a Z-axis direction (optical axis direction of the objective lens) along a specific line can be formed from the three-dimensional images. This facilitates measurement of the size, such as a cross-sectional area or a volume, of dendrite.

In another preferred embodiment of the analysis apparatus according to the present invention, the signal processing device includes a charge level conversion unit that converts the generated color image into a charge level indicative of a quantity of electricity occluded in the anode active material of the secondary battery. The signal processing device stores the obtained charge level and the time information into a fifth memory. In the charging and discharging reaction of the secondary battery, Li ions are discharged from the cathode during charging, and electrons are received by the anode. Li ions are occluded between graphite layers as Li-GIC (lithium-graphite intercalation compound). The color of the compound structure changes depending on the degree of intercalation of Li ions between graphite layers. There are different stages depending on how many graphene layers (a layer of graphite) are present between an Li layer and an Li layer. For example, the case where one layer is present is referred to as "Stage 1"; the case where two layers are present is referred to as "Stage 2"; and the case where n layers are present is referred to as "Stage n". Further, the color or hue of the active material corresponds to the state of charge (quantity of charged electricity) of the active material. Accordingly, after converting a color change in an area to be analyzed into a hue change, a charge level indicative of a charging depth of the second battery is calculated through the hue and the state of charge. This configuration enables quantification of the charging depth. Further, a charge level is calculated from a color charge distribution of the image pickup field during charging and discharging. This makes it possible to output the charge level as two-dimensional image information. The charge level conversion unit includes a unit that converts time-series color omnifocal images into hue scale values for each pixel, and a unit that calculates a charge level by using the state of charge and a scale value converted into a hue scale.

In a preferred embodiment of the analysis apparatus according to the present invention, the output unit is connected with an input device for inputting designation information for designating analysis data to be output. The output unit outputs analysis data designated by an operator.

In a preferred embodiment of the analysis apparatus according to the present invention, when a color image in a moving image format is designated as the designation information, the output unit outputs analysis data to display the color image in the moving image format, or analysis data to display the color image in the moving image format and the state charge in parallel in time series. The color image in the moving image format is output together with the state of charge calculated from the detected charging and discharging current amount. This makes it possible to display a temporal change of the state of charge or the charging depth and a temporal change of the color images of the anode and cathode active materials in parallel on the same screen. Accordingly, a temporal change of the state of charge calculated from the charging and discharging data and a change in color of the anode and cathode active materials can be visually recognized.

More importantly, the output of a moving image enables visual recognition of the generation of dendrite and the growth state thereof. Dendrite is white dendritic crystal and has a color different from that of the active materials. Accordingly, dendrite can be distinguished from the surrounding active materials and visually recognized. In this case, the display of the moving image and the state of charge in parallel enables visual recognition of the generation and growth of dendrite and the state of charge in a corresponding manner. This allows an observer to specify the state of change at the time when dendrite is generated and to recognize the relationship between the growth of dendrite and the quantity of charged electricity.

In another preferred embodiment of the analysis apparatus according to the present invention, when a three-dimensional image in a moving image format is designated as the designation information, the output unit outputs analysis data to display analysis data to display the three-dimensional image in moving image format, or analysis data to display the three-dimensional image in the moving image format and the state of charge in parallel in time series. The display of the three-dimensional image and the state of charge in parallel enables observation of changes in shape and size of each active material with respect to a change in the state of charge. Further, since the three-dimensional image corresponds to the state of charge, the actual quantity of charged electricity (state of charge) can be correlated with a change in shape of each active material. Furthermore, when dendrite is generated, the growth rate or the growth state in the three-dimensional direction can be visually recognized. Particularly, a region in which dendrite is generated is specified from the three-dimensional image. Accordingly, the display of the cross-sectional shape (altitude difference profile) of the region enables measurement of a change in size of the generated dendrite.

In a preferred embodiment of the analysis apparatus according to the present invention, when a color image of a partial area of the secondary battery is designated as the designation information, the output unit outputs analysis data to display time-series color images of the designated area on a temporal axis in time series, or analysis data to display color images of the designated area and the state of charge on the same temporal axis in parallel in time series. In this case, when an area of a part of one active material is designated as the designated area, for example, how the color of one active material changes depending on the state of charge can be visually recognized. Further, quantitative analysis can be performed by converting the color into a hue.

In a preferred embodiment of the analysis apparatus according to the present invention, when a color image of a linear area is designated as the designation information, the output unit outputs analysis data to display time-series color images of the designated linear area on the temporal axis in time series, or analysis data to display color images of the designated linear area and the state of charge on the same temporal axis in parallel in time series. When a linear area is designated, a Cartesian coordinate system specified by the position on the designated line and the temporal axis is formed. This makes it possible to display a change in color of each active material layer as a two-dimensional image. In this case, a reaction rate distribution of local electrochemical reaction can be formed based on the rate of change in color. For example, a time required for change into a specific hue from the start of charging is calculated for each pixel, thereby obtaining a local reaction rate distribution. Further, when a line extending across a plurality of active materials along an inter-electrode direction is designated as the linear area, the reaction rate of each active material in the direction from the cathode to the anode can be recognized. In other words, a change in color of a plurality of active materials arranged in the electrode direction, that is, a temporal change of the charging depth can be visually recognized. In this case, it is expected to obtain useful information on the state of formation of an electrical network connecting the active materials.

It is also possible to display the time-series color images of the designated linear area by the Cartesian coordinate system using the state of charge as the other axis. In this case, it is preferable to expand or contract the display width for arranging one line.

In a preferred embodiment of the analysis apparatus according to the present invention, when a state of charge or an elapsed time after charging is started is designated as the designation information, the output unit outputs a two-dimensional color image corresponding to the designated state of charge, or a two-dimensional color image corresponding to the designated elapsed time. In this preferred embodiment, time-series color images and time-series states of charge are temporally linked. Accordingly, the two-dimensional color image at the designated time or in the designated state of charge can be displayed on a monitor. For example, when an output of a color image having a state of charge=50% is designated, a color omnifocal image at the state of charge=50% can be displayed on the monitor. Further, when an output of color images of a plurality of states of charge is designated, color images in the states of charge can be displayed in parallel on the same screen. As a result, the correspondence between the electrical characteristics of the entire battery and the image characteristics within the battery can be recognized. This makes it possible to recognize a local state change and a state change of each active material in various charge levels and statuses of charge. Furthermore, when the generation of dendrite is visually recognized during output of a moving image, for example, the operator may store the value of the time when dendrite is generated, or of the state of charge. With this configuration, the two-dimensional color images of the cathode active material layer, the separator, and the anode active material layer at the time when dendrite is generated can be displayed only by inputting the value of the time or the state of charge. This makes it possible to recognize the detailed aspects of the entire battery.

In a preferred embodiment of the analysis apparatus according to the present invention, when the relationship between the state of charge or the elapsed time after charging is started and the charge level is designated as the designation information, the output unit outputs two-dimensional image information indicating a charge level distribution corresponding to the designated state of charge, or two-dimensional image information indicating a charge level distribution corresponding to the designated elapsed time. The charge level can be quantified by a grayscale of an appropriate color scale, and can be displayed as a two-dimensional image. This makes it possible to quantitatively recognize a local charge rate distribution. Accordingly, the corresponding charge level can be output as a two-dimensional image by designating the state of charge or the elapsed time.

The analysis apparatus according to the present invention includes: an image pickup device that captures a color image of a secondary battery; a unit that detects charging and discharging data (a charging and discharging voltage and a charging and discharging current) during charging and discharging; and a signal processing device that temporally links image data and the charging and discharging data. This configuration enables output of analysis data linking the image data and the electrical data. Particularly, analysis data temporally linking a color image and a state of charge indicative of a quantity of electricity accumulated in the secondary battery can be output. As a result, various types of analysis data can be output using electrical data and color image data which are temporally linked, and the state of charge obtained after the start of charging and discharging of the secondary battery, for example, and a color image or a three-dimensional image can be output in a moving image format in parallel. Further, a color image or a three-dimensional image corresponding to the quantity of charged electricity of the secondary battery can also be output by designating the state of charge. Furthermore, the color image in a moving image format and the state of charge are output in parallel. Accordingly, the quantity of charged electricity at the time when dendrite is generated and the relationship between the quantity of charged electricity and the growth process of dendrite can also be recognized.

Moreover, according to the experiments conducted by the present inventors, it has turned out that the color of graphite, which is an anode active material of a lithium ion secondary battery, changes in a multistage manner from gray to turquoise, blue, red, and gold in the stated order depending on the state of charge (S.O.C.). Accordingly, charging and discharging are performed in the equilibrium state, that is, charging and discharging are performed at a sufficiently moderate rate, by using the analysis apparatus according to the present invention. This enables acquisition of basic data representing the correspondence between the color of each active material and the state of charge during charging and discharging in the equilibrium state. Specifically, changes in color of graphite from gray to turquoise→blue→red→gold can be converted into angle values that are substantially continuous on the Munsell hue scale. Thus, a change in color of each active material can be converted into a hue change and quantified by using the Munsell hue circle. The converted hue scale value is converted into the corresponding state of charge, thereby making it possible to quantify the color of each active material and output the quantitative analysis data. The basic data representing the color of each active material and the state of charge, which are measured in the equilibrium state, is used. This configuration makes it possible not only to recognize a state change of the secondary battery during charging and discharging as a color change, but also to recognize the state change as quantified data. It is also possible to preliminarily acquire the basic data representing the color of each active material and the state of charge. With this configuration, a rate distribution of local electrochemical reaction of the secondary battery can be recognized as quantified information from a color distribution of color images of each active material in charging and discharging tests conducted under various conditions, such as rapid charging. Further, the basic data representing the relationship between the color of each active material and the state of charge is used. The amount of Li ions intercalated in graphite can also be measured from the color of each active material detected in the charging and discharging tests. As a result, the use of the analysis apparatus according to the present invention enables acquisition of information useful for the development of various types of secondary batteries.

In the present invention, a secondary battery for experiment is prepared and disposed in an observation cell. The secondary battery for experiment is connected to a charging and discharging controller through a connection terminal of the observation cell to perform charging and discharging and measure, as time-series data, charging and discharging data including a charging and discharging voltage and a charging and discharging current. Further, the color confocal image pickup device captures images of the internal structure of the secondary battery during charging and discharging at a predetermined time interval, along with the acquisition of the charging and discharging data. As a result, a color omnifocal image of the time-series data can be formed. The captured color images of the internal structure of the secondary battery and the charging and discharging data are linked to thereby create analysis data in which the charging and discharging data and the color images are temporally correlated. According to the results of the experiments conducted by the present inventors, it has turned out that the color of graphite, which is an anode active material of a secondary battery, changes from gray to blue, red, and gold in the stated order depending on the state of charge or the quantity of charged electricity. Color images of each active material during charging and discharging are captured, and the obtained color images and the states of charge are temporally linked. This configuration enables display of the moving image of each active material during charging and discharging and the state of charge in parallel on the monitor. Furthermore, charging and discharging are performed in the equilibrium state and the basic data representing the relationship between the color of each active material and the state of charge is acquired. With this configuration, the electrical quantity of Li ions intercalated in each active material is obtained from the color of each active material in various charging and discharging tests. Accordingly, a rate distribution of electrochemical reaction of the secondary battery can also be output as analysis data from the captured color images. It is expected to obtain information useful during evaluation of the performance of the secondary battery by acquiring various types of image analysis data.

According to the present invention, an analysis apparatus and an analysis method which are capable of recognizing a local state change of the internal structure of the secondary battery can be achieved. Furthermore, an analysis apparatus and an analysis method which are capable of outputting analysis data linking a temporal change of the internal structure of the secondary battery and a temporal change of the electrical characteristics of the entire battery can be achieved.

Figure 1B:
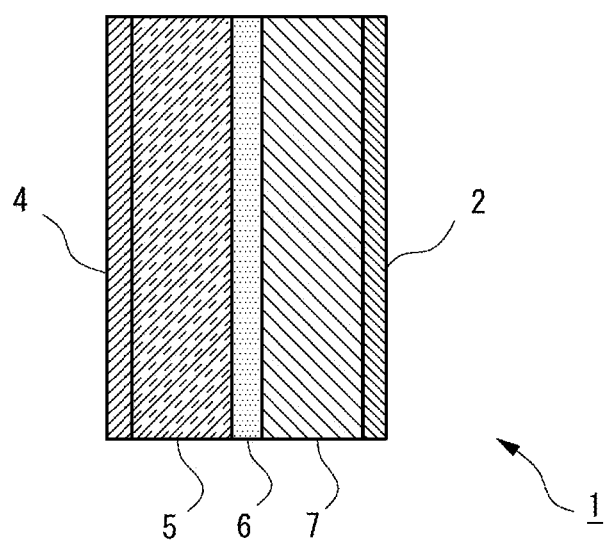
FIG. 1B is a diagrammatic sectional view showing an exemplary configuration of a secondary battery.

FIGS. 1A and 1B are diagrams each showing an exemplary configuration of a secondary battery. FIG. 1A shows a full-cell structure including both a cathode and an anode, and FIG. 1B shows a half-cell structure formed only of an anode. In this embodiment, a lithium ion battery is described by way of example as a secondary battery 1. The secondary battery has a laminated structure including a cathode, an anode, and a separator. The separator is disposed between the cathode and the anode.

The cathode includes a cathode current collector 2 and a cathode active material layer 3 formed thereon. For example, rolled aluminum foil is used as the cathode current collector 2, and lithium cobalt oxide ($LiCoO_2$) is used as the cathode active material. The anode includes an anode current collector 4 and an anode active material layer 5 formed thereon. For example, copper foil is used as the anode current collector 4, and graphite is used as the anode active material. A separator 6 is disposed between the cathode and the anode, thereby isolating the cathode and the anode. The cathode and the anode are filled with electrolyte. An organic electrolyte obtained by dissolving lithium salt, such as LiPF6, in an organic solvent such as ethylene carbonate (EC) is used as the electrolyte.

The lithium ion battery of a half cell structure shown in FIG. 1B has a structure in which the cathode active material layer 3 is replaced with a metallic lithium foil 7. This structure is suitable for analyzing an image of a state change of the anode active material.

In this embodiment, color images of the anode active material layer during charging and discharging are captured using the secondary battery having a half cell structure. An image analysis of a state change of the anode active material is performed based on the color images of the secondary battery. During capturing of color images, illumination light is projected through the observation window from a direction parallel to the extending direction of the current collectors and the active material layers, and a color image of a cross-section of the battery is captured in the direction from the cathode to the anode as shown in FIG. 1A.

Figure 2:
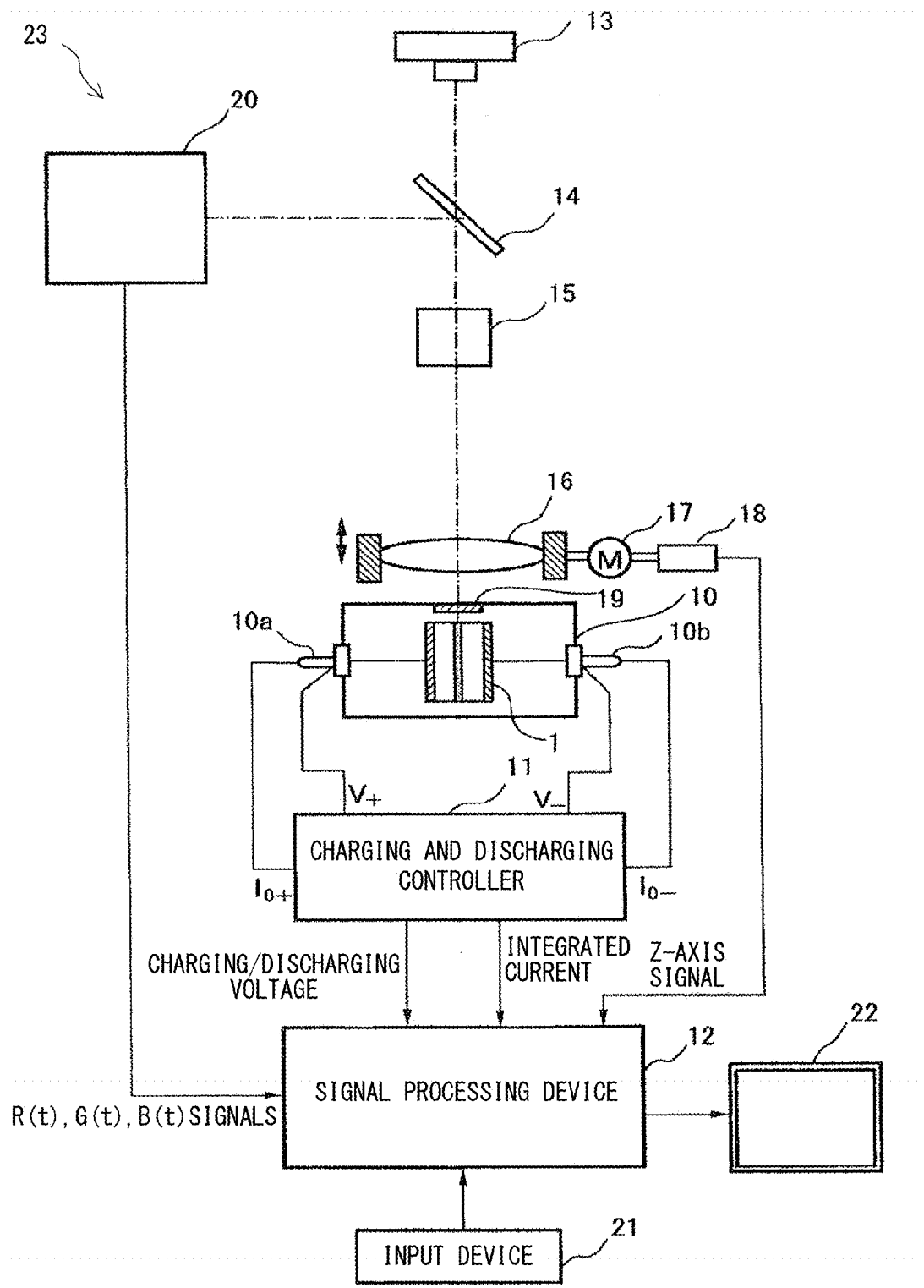
FIG. 2 is a diagram showing an overall configuration of an analysis apparatus according to the present invention.

FIG. 2 is a diagram schematically showing the overall configuration of the analysis apparatus according to the present invention. The secondary battery 1 for experiment, which is to be subjected to image analysis, is disposed in an observation cell 10. The observation cell 10 is sealed and the inside of the observation cell 10 is filled with inert gas such as argon gas. The lithium ion battery to be analyzed is held in the atmosphere of inert gas.

The observation cell 10 is provided with a transparent window 19 as the observation window. The observation cell 10 is also provided with a first connection terminal 10a and a second connection terminal 10b. These connection terminals 10a and 10b are respectively connected to the cathode current collector 2 and the anode current collector 4 of the secondary battery 1. The analysis apparatus includes a charging and discharging controller 11 that controls charging and discharging of the secondary battery 1. The charging and discharging controller 11 includes an I0+ terminal and an I0− terminal.

The first connection terminal 10a is connected to the I0+ terminal, and the second connection terminal 10b is connected to the I0− terminal. As a method for controlling charging and discharging, a constant voltage constant current (CVCC) method can be used, for example. Specifically, charging and discharging are controlled by a control method in which charging is performed by supplying a constant current to the secondary battery 1 at the start of charging, and after a fully-charged state is reached, charging is performed with a constant voltage. Further, discharging can be controlled by constant current control. The first connection terminal 10*a* and the second connection terminal 10*b* are respectively connected to a V+ terminal and a V− terminal of the charging and discharging controller 11. Accordingly, a voltage detection unit which is provided to the charging and discharging controller detects the charging and discharging voltage (battery voltage) as time-series data. The charging and discharging controller 11 also includes a current detection unit that detects a current flowing through the secondary battery 1. The current detection unit of the charging and discharging controller 11 outputs, as time-series data, values of the current flowing through the secondary battery 1. The detected charging and discharging voltage and charging and discharging current are output to a signal processing device 12 as the charging and discharging data.

The operator sets charging and discharging conditions through the input device, and thereby it is possible to conduct charging and discharging tests under various conditions. For example, high-rate charging and low-rate charging can be performed by setting the amount of current to be supplied. The analysis apparatus captures color images under the set charging and discharging conditions. It is particularly important to set the supply rate and discharge rate of the current amount to a low rate. This setting enables charging and discharging in the equilibrium state, thereby making it possible to acquire the basic data representing the relationship between the color of each active material and the quantity of charged electricity (state of charge) during charging and discharging.

Next, the image pickup device that captures color images of the internal structure of the secondary battery, in particular, each active material layer during charging and discharging, will be described. In this embodiment, a color confocal image pickup device 23 is used as the image pickup device. The color confocal image pickup device 23 is capable of capturing an omnifocal image in focus over substantially an entire image pickup field, and forming a three-dimensional image of a sample. In other words, to observe local electochemical reaction of a secondary battery as a color image in the present invention, the color confocal image pickup device 23 captures a color image in focus over the entire field of view.

A white light source that generates white light, such as a xenon lamp, a mercury lamp or a white laser, is used, for example, as an illuminating light source 13. A white illumination beam emitted from the illuminating light source 13 enters a beam splitter 14. The beam splitter 14 has a function of splitting an illumination beam toward the secondary battery 1 from the illuminating light source, and a reflected beam reflected by the secondary battery. The beam splitter 14 is, for example, a half mirror. The illumination beam passing through the beam splitter 14 enters a two-dimensional scanner 15. The two-dimensional scanner 15 performs two-dimensional scanning of the illumination beam in X and Y directions. The illumination beam scanned by the two-dimensional scanner 15 enters an objective lens 16. The illumination beam is converted into a focused beam by the objective lens 16, and enters the observation cell 10. The objective lens 16 is connected with a motor 17, and thus is continuously movable at a predetermined rate in the optical axis direction under control of the controller. Accordingly, the focused spot of the illumination beam is continuously displaced along the optical axis direction during the two-dimensional scanning. The position in the optical axis direction of the objective lens 16 is detected by a distance sensor 18. The distance sensor 18 supplies, to the signal processing device 12, information on a relative distance between the objective lens 16 and the surface of the secondary battery 1 based on the detection result. An objective lens with thickness compensation function is desirably used as the objective lens 16.

The illumination beam enters the secondary battery 1 during charging and discharging through the transparent window 19 provided in the observation cell 10. In this embodiment, the color confocal image pickup device 23 captures color images of the anode active material layer from the direction parallel to the extending direction of the current collectors, i.e., from the cross-sectional direction of the secondary battery 1. Accordingly, the secondary battery 1 is disposed such that the cross-section between the cathode and the anode faces the transparent window 19. The illumination beam is two-dimensionally scanned by the two-dimensional scanner 15. Thus, the surface of the active material layer of the secondary battery during charging and discharging is two-dimensionally scanned with a focused illumination beam. Further, the surface of the active material layer is two-dimensionally scanned with the illumination beam, while the objective lens is moved in the optical axis direction. As a result, a two-dimensional image (omnifocal image) in focus over the entire field of view is captured. Accordingly, at an uneven surface of each active material exposed to the surface of the corresponding active material layer, an image in focus over the entire uneven surface is captured.

The reflected beams which are reflected by the active material layers of the secondary battery during charging and discharging are collected by the objective lens 16 through the transparent window 19. The reflected beam from the objective lens 16 enters the beam splitter 14 through the two-dimensional scanner 15. Then, the reflected beam is reflected by the beam splitter 14 and enters a color imaging sensor 20. The color imaging sensor 20 includes an imaging lens system, a color separation optical system, and three image pickup elements. The color separation optical system separates the incident reflected beam into RGB color component light beams. The three image pickup elements receive the respective RGB color component light beams. The imaging optical system forms an image of the secondary battery 1 on each image pickup element.

A line sensor is used as each image pickup element. Accordingly, the imaging optical system of this embodiment constitutes a color confocal optical system, and captures a color confocal image with high resolution. In one image pickup operation, a plurality of color images is captured while the objective lens 16 is moved by a predetermined distance in the optical axis direction. Assuming that a time required for one pickup operation is 30 seconds, for example, the objective lens is moved by a predetermined distance for 30 seconds, and during this period of time, a plurality of color images is captured. The image pickup operation can be performed at a time interval of one minute, for example. Accordingly, color images are captured at an interval of one minute. RGB color image signals output from the three image pickup elements are supplied as time-series data to the signal processing device 12. Then, color images of the secondary battery 1 are formed through signal processing in the signal processing device 12.

The signal processing device 12 is connected with an input device 21, such as a keyboard, and a monitor 22. The operator can input, through the input device 21, designation information to designate analysis data to be output. The designated analysis data is displayed on the monitor 22.

Figure 3:
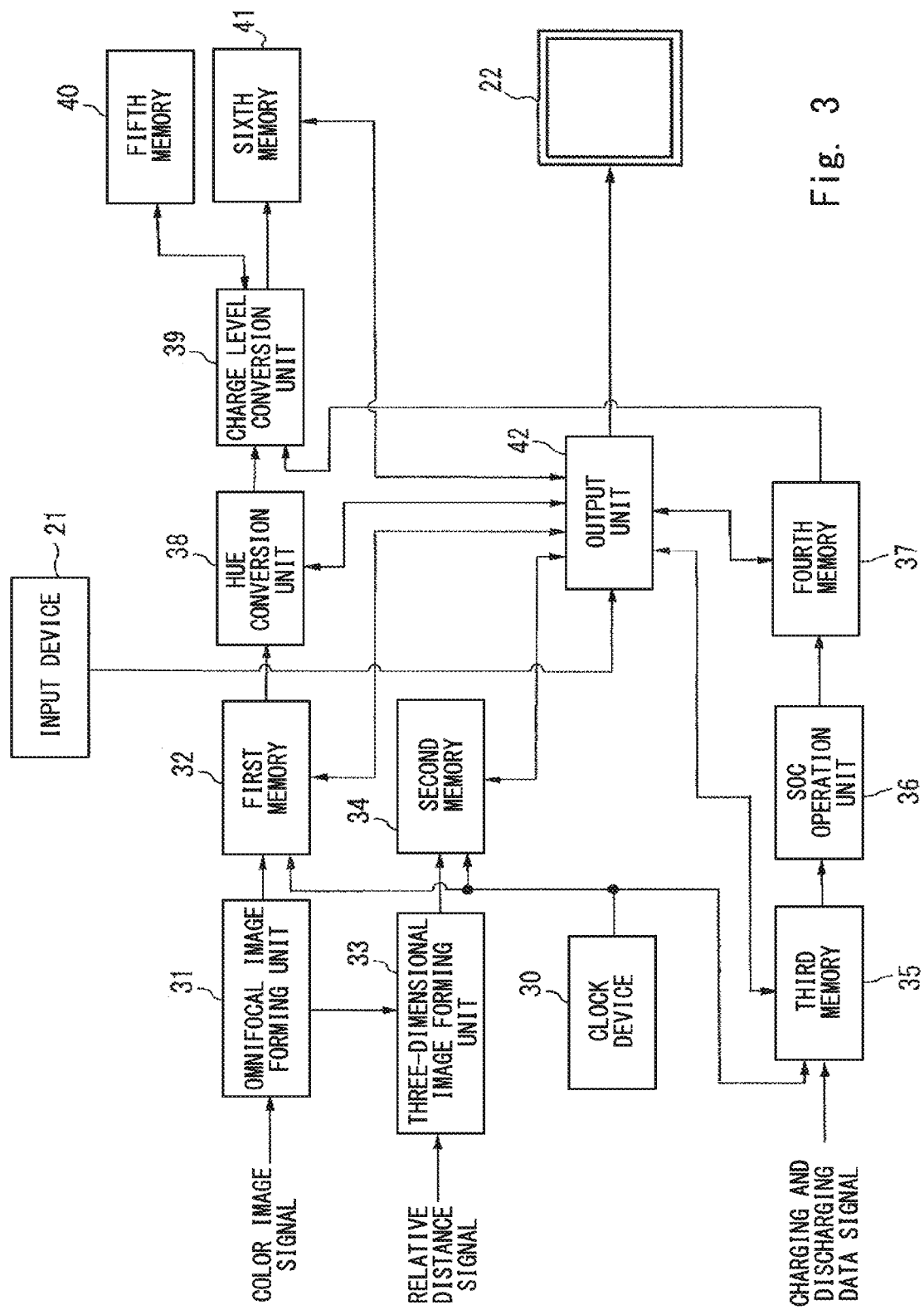
FIG. 3 is a diagram showing an example of a signal processing device.

FIG. 3 is a block diagram showing an example of the signal processing device 12. The signal processing device 12 includes a clock device 30. The clock device 30 is used to temporally link image data and charging and discharging data. For this reason, the clock device 30 outputs a clock signal to each of the first to third memories. The signal processing device 12 links color image data and charging and discharging data by using the clock signal output from the clock device 30 as a common clock signal. In other words, the start of charging and discharging and an elapsed time after the start of charging is started are measured based on the clock signal output from the clock device 30. Accordingly, time information is measured based on the clock signal. The acquired color image and charging and discharging data and the time information based on the clock signal are stored as a pair into a memory. Accordingly, each of the clock device 30 and the memory functions as a link unit that links the image data and the charging and discharging data.

The RGB color image signals are supplied to an omnifocal image forming unit 31. The omnifocal image forming unit 31 detects a maximum luminance value for each pixel in a plurality of confocal images captured while the objective lens 16 is moved in the optical axis direction. Then, the omnifocal image forming unit 31 forms, as an omnifocal image, a two-dimensional image which is formed of each maximum luminance value. Specifically, the focused spot of the illumination beam is displaced in the optical axis direction by moving the objective lens 16 in the optical axis direction. When the focused spot of the illumination beam is positioned on the surface of the secondary battery, the maximum luminance value is output from the image pickup element. A plurality of two-dimensional images is captured while the objective lens 16 is moved in the optical axis direction. The maximum luminance value is detected for each pixel. This configuration enables formation of an omnifocal image in focus over the entire image pickup area. Accordingly, when unevenness is present on the cross-sectional area of the active material layer of the secondary battery, the omnifocal image forming unit 31 forms a color image in focus over the uneven surface. Omnifocal images are formed at a time interval of one minute, for example.

The omnifocal image forming unit 31 outputs a color omnifocal image signal, which is based on the maximum luminance value for each pixel, to each of a first memory 32 and a three-dimensional image forming unit 33. The first memory 32 also receives the clock signal output from the clock device 30. The first memory 32 sequentially stores, as a pair, the time-series color omnifocal images and the time information based on the clock signal.

A relative distance signal (Z-axis information) output from the distance sensor 18 is supplied to the three-dimensional image forming unit 33. The relative distance signal is a signal including information on a relative distance between the objective lens 16 and the surface of the secondary battery 1. Further, the three-dimensional image forming unit 33 is supplied with the color omnifocal image, which is based on the maximum luminance value for each pixel, from the omnifocal image forming unit 31. Accordingly, the three-dimensional image forming unit 33 forms a three-dimensional image of the surface of the secondary battery by using the relative distance information obtained at the time when the maximum luminance value is detected. Specifically, when the maximum luminance value is output from each image pickup element, the focused spot of the illumination beam is positioned on the surface of the secondary battery 1. This configuration enables formation of a three-dimensional image of the surface of each active material layer of the secondary battery by using the positional information or distance information in the optical axis direction obtained at the time when the maximum luminance value is output. Three-dimensional images are continuously formed at a time interval of one minute, as with the formation of omnifocal images.

The three-dimensional image forming unit 33 sequentially supplies the three-dimensional image signal of each three-dimensional image to a second memory 34. The second memory 34 is also supplied with clock information which is supplied from the clock device 30. The second memory 34 stores, as a pair, the received three-dimensional image signal and the time information based on the clock signal.

The time-series charging and discharging data signals output from the charging and discharging controller 11 are supplied to a third memory 35. The charging and discharging data signal is a signal representing the charging and discharging data on the charging and discharging voltage and the charging and discharging current. The third memory 35 also receives the clock signal output from the clock device 30. The third memory 35 stores, as a pair, the charging and discharging voltage and charging and discharging current, which are the charging and discharging data, and the time information. The charging and discharging data stored in the third memory 34 is supplied to an SOC operation unit 36. The SOC operation unit 36 obtains, from the charging and discharging current, the state of charge (S.O.C.) after charging is started.

The state of charge is data indicative of a quantity of electricity accumulated in the secondary battery. For example, the SOC operation unit 36 calculates an integrated quantity of electricity from the charging and discharging data. Assuming that a fully charged state is 100%, the SOC operation unit 36 calculates the quantity of charged electricity, which is normalized based on the fully charged state, as the state of charge. The calculated state of charge is stored into a fourth memory 37 together with the time information based on the clock signal. As a result, the state of charge linked to the image data is stored into the fourth memory 37.

Figure 4:
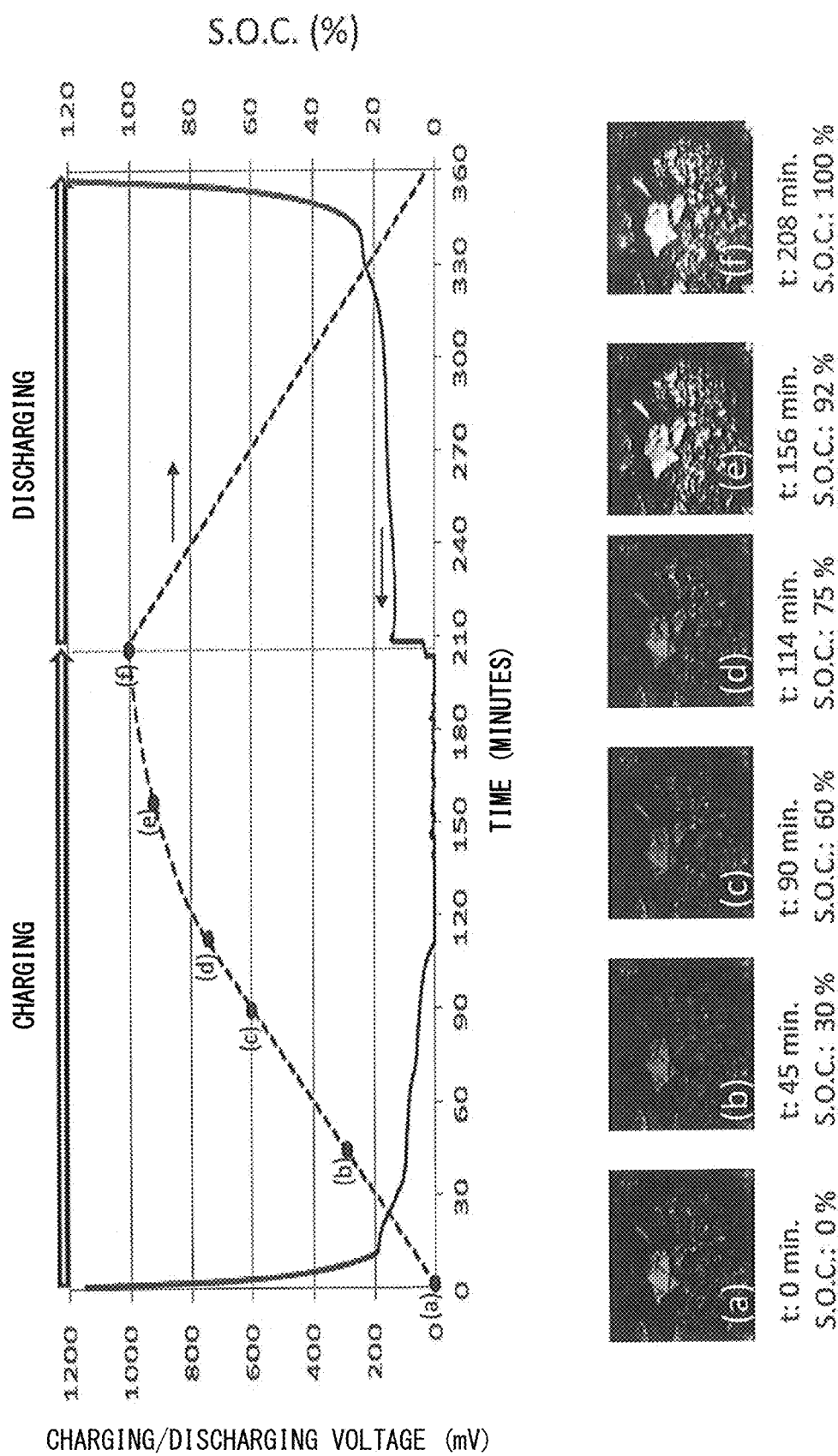
FIG. 4 is a graph showing relationships among an elapsed time after charging is started, a state of charge, and each color image.

Next, a description is made of color analysis for obtaining a reaction rate distribution of electrochemical reaction from a color image by use of the color image data and the charging and discharging data. First, basic data representing the correspondence between the color of each active material and the state of charge during charging and discharging will be described. FIG. 4 shows color images and electrical characteristics which are actually obtained when charging and discharging are performed in the equilibrium state. FIG. 4 shows the relationships among the color image characteristics, the state of charge, and the charging and discharging time. The color images in the equilibrium state can be captured by setting the rate of each of the supply current amount and the discharge current amount to a low rate. In this case, it is determined whether charging and discharging are performed in the equilibrium state, based on the generation status of an inflection point of charging and discharging voltage characteristics and the uniformity of the color of each active material during charging and discharging.

The upper section of FIG. 4 is a graph showing the relationships among the charging and discharging time, the charging and discharging voltage, and the state of charge. The lower section of FIG. 4 shows color omnifocal images obtained at the times respectively represented by (a) to (f) on the state-of-charge curve. In this embodiment, charging is performed under the condition of 0.3 c, and full-charging is performed for 3 hours and 20 minutes. In the graph shown in the upper section of FIG. 4, the horizontal axis represents the temporal axis; the vertical axis on the left side represents the charging and discharging voltage; and the vertical axis on the right side represents the state of charge (S.O.C.). The solid line indicates the charging and discharging voltage, and the dashed line indicates the state of charge. The charging and discharging voltage rapidly increases immediately after charging is started. Then, the charging and discharging voltage reaches 200 mV in about 20 minutes, and reaches a saturated state after the lapse of about 100 minutes. The state of charge increases substantially linearly according to the elapsed time after charging.

On the dashed curve representing the state of charge, the times corresponding to the states of charge=0%, 30%, 60%, 75%, 92%, and 100% are represented by (a) to (f), respectively. The color omnifocal images captured in the states of charge represented by (a) to (f) are arranged in the lower section of FIG. 4. In the case where the active material, the color of which has changed most significantly, is focused in each color omnifocal image, the color of the surface of the active material is turquoise gray (image "a") when the S.O.C.=0. The lithium ion battery used in this experiment is a sample on which charging and discharging are preliminarily performed, so a smaller amount of electric charge remains due to the preliminary experiment. Thus, it can be recognized that the remaining electric charge is captured as a turquoise gray image. When charging is started thereafter, the color changes into turquoise and then into blue (image "b" with S.O.C.=30%). When the charging progresses and the S.O.C. reaches 60%, most of blue portions disappear and the color changes into red (image "c"). When the charging further progresses and the S.O.C. reaches 75%, the active material whose color has changed into red starts glowing gold (image "d"). Further, when the S.O.C.=92%, the color of a number of active materials changes into gold (image "e"). When the charging further progresses and the S.O.C. reaches 100%, the gold glow becomes more intense (image "f"). In this manner, the color of graphite, which is an anode active material, changes from gray to turquoise, blue, red, and gold in the stated order according to the state of charge.

The charging and discharging tests described above involve the charging and discharging which are assumed to be in a sufficiently equilibrium state. Accordingly, the state of charge calculated from the measured charging and discharging data can be regarded as a representative of the characteristics of the entire anode. Therefore, it is possible to relate the color of the anode active material to the state of charge calculated from the charging and discharging data, thereby obtaining reference data representing a correspondence between the color of the active material and the state of charge.

Figure 5:
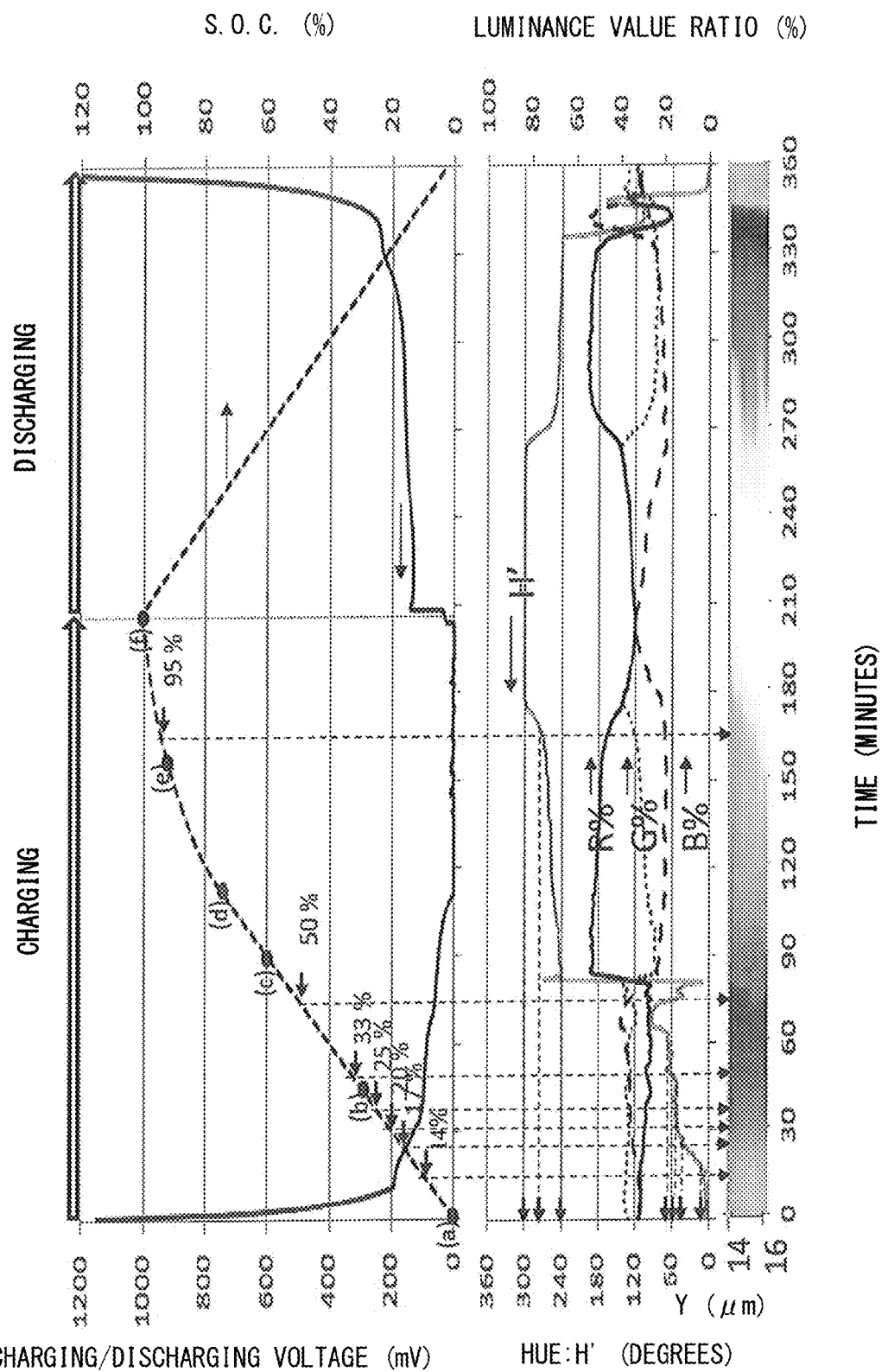
FIG. 5 is a graph showing relationships among an elapsed time after charging is started, a state of charge, luminance values of RGB image signals, a hue scale, and each color image.

Next, the quantification of the color of an active material during charging and discharging will be described. As described above, it has been confirmed that the color of the anode active material (graphite) changes in multiple steps depending on the state of charge. Accordingly, in the present invention, quantification is performed such that the color of an active material corresponds to the quantity of charged electricity, by use of the Munsell hue circle and the state of charge. FIG. 5 shows reference data for achieving the quantification. The uppermost stage of FIG. 5 is a graph showing the state of charge with respect to the charging and discharging time, as with the graph of FIG. 4. The middle stage of FIG. 5 shows the luminance value ratio of RGB image signals and the Munsell hue with respect to the charging and discharging time. The lowermost stage of FIG. 5 shows a change in color of a color image of a part of an active material. In FIG. 5, the horizontal axis represents an elapsed time after charging is started. Accordingly, the uppermost stage of FIG. 5 represents a temporal change of the state of charge (S.O.C.) and the charging and discharging voltage. The middle stage of FIG. 5 represents a temporal change of the luminance value ratio (vertical axis on the right side) of RGB image signals and a temporal change of Munsell hue H' (angle values of 0 to 360° of the vertical axis on the left side). The lower most stage of FIG. 5 shows a temporal change of the color of a partial area of one active material.

In this embodiment, instead of Munsell hue H, the hue scale value H' which is obtained by shifting the hue by an angle of 120° corresponding to turquoise is used so that the all colors of turquoise→blue→red→gold are included in the Munsell hue circle. In the case of using the hue scale value H' obtained by shifting the hue by 120° as shown in the middle stage of FIG. 5, when the angle of the hue gradually increases from the vicinity of 0° after charging is started and when the color changes into gold, the hue scale value of graphite is saturated at 300°. Accordingly, the color of each active material can be expressed as a numerical value (angle value) by converting the color of each active material, which is obtained after charging and discharging are started, into the hue scale value H'.

In this embodiment, the data shown in FIG. 5, which is obtained by performing charging and discharging in the equilibrium state, is used as the reference data. The signal processing device 12 quantifies the local color of the active material by using the reference data. The use of a half cell has an advantage that a state change of only the anode can be observed without any adverse effect on the cathode. The color of the active material is converted into the hue scale value (H') and quantified by using the correspondence between the color of the active material, which changes from turquoise to gold, and the hue scale value (H') as shown in FIG. 5. This conversion is performed by converting the RGB luminance values of the color image into each hue scale value. Next, the hue scale value is converted into the state of charge by using the correspondence between the hue scale value (H') and the state of charge (S.O.C.) of the reference data as shown in FIG. 5. For example, in FIG. 5, hue scale value=60° corresponds to S.O.C.=60%; hue scale value=260° corresponds to S.O.C.=85%; and hue scale value=300° corresponds to S.O.C.=100%.

Figure 6:
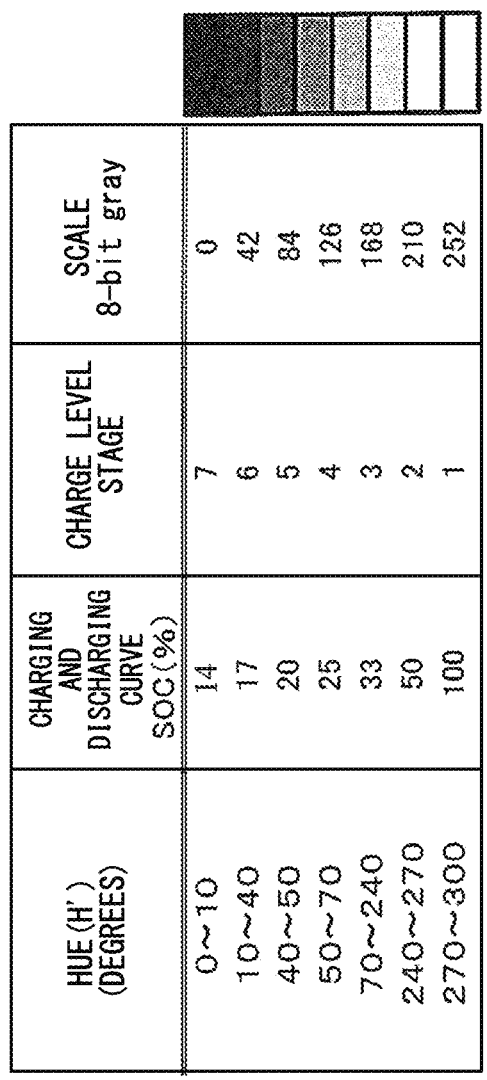
FIG. 6 is a table showing relationships among a hue of each color image, a state of charge, a charge level, and a grayscale value.

Further, in this embodiment, seven stages of charge levels corresponding to the respective states of charge are set as an index corresponding to the quantity of charged electricity. This allows the state of charge to be converted into the corresponding charge level. FIG. 6 is a table showing the relationships among the charge levels, which are divided into seven stages, the state of charge, and the hue. The number of stages of charge levels indicates the number of graphene layers existing between a Li layer and a Li layer. Stage 1 indicates a state in which one graphene layer is present, i.e., a state in which the value of the state of charge is 100%. Stage 2 indicates a state in which two graphene layers are present, i.e., the state of charge=50%. Stage 3 indicates a state in which three graphene layers are present, i.e., the state of charge=33%. Stage 4 indicates a state in which four graphene layers are present (state of charge=25%). Stage 5 indicates a state in which five graphene layers are present (state of charge=20%). Stage 6 indicates a state in which six graphene layers are present (state of charge=17%). Stage 7 indicates a state in which seven graphene layers are present (state of charge=14%). Such a classification defines the relationship between each charge level and each state of charge (S.O.C. % value). Each charge level can be displayed as an 8-bit grayscale. In this manner, the indication of the quantity of charged electricity by using each charge level makes it possible to obtain information useful for calculating the electrical quantity of Li ions intercalated in graphite.

The color of a captured color image is converted into a hue by the conversion operation described above. The hue is converted into a state of charge. Further, the state of charge is converted into a charge level. These three conversion processes enable quantification into seven stages of charge levels indicative of the quantity of charged electricity or the electrical quantity of intercalated Li ions. Each charge level can be displayed as an 8-bit grayscale. The display of a color image in seven stages of grayscale enables display of an electricity storage state of a local area of the secondary battery 1 or a reaction rate distribution of electrochemical reaction as a two-dimensional image.

A color analysis according to the present invention will be described with reference to FIG. 3. During the color analysis, basic data is acquired. Specifically, charging and discharging are performed at a sufficiently low rate at which the equilibrium state is observed, and the color images and charging and discharging data, which are temporally linked, are obtained. The time-series color images thus obtained are stored into the first memory 32 and are supplied to a hue conversion unit 38. The hue conversion unit 38 generates Munsell hue scale values H from the luminance values (R, B, G) of the RGB color image signals for each pixel based on the following expression.

$$\tan H = \{\sqrt{3}(G-B)/(2R-G-B)\} \times (180/\pi)$$

Turquoise, which is the color obtained immediately after charging is started, corresponds to 120° of the Munsell hue scale. This embodiment uses the hue scale H' which is offset by −120° from the Munsell hue scale H. The hue scale values can be set depending on the sample to be analyzed. The obtained hue scale values are supplied to a charge level conversion unit 39. The charge level conversion unit 39 also receives the time-series states of charge. The time-series states of charge are created from the charging and discharging data which is measured in parallel with the capturing of the color image. The charge level conversion unit 39 stores, in a manner linked to each other, the hue values (angle values) and the states of charge into a fifth memory 40, based on the temporal axis. In other words, the fifth memory stores the relationship, which is a reference for the secondary battery 1 to be analyzed, between each hue scale value, and each state of charge.

After the acquisition of the basic data is completed, a full-scale image analysis is performed. Specifically, the charging and discharging conditions designated for the same secondary battery 1 or the secondary battery 1 of the same material system are input. Then, a charging and discharging test is started under the charging and discharging conditions. Along with the start of charging and discharging, color images of the lithium ion battery are captured and charging and discharging data is acquired. The time-series color images are stored into the first memory and are further supplied to the hue conversion unit 38. The hue conversion unit 38 converts the RGB luminance values into hue scale values for each pixel. The converted scale values are supplied to the charge level conversion unit 39. The charge level conversion unit 39 converts the received scale values into states of charge by using the reference data stored in the fifth memory 40. The reference data is data that defines the relationship between each hue scale value and each state of charge. Further, the charge level conversion unit 39 converts the states of charge into charge levels.

Furthermore, the converted charge levels are converted into grayscale values. A sixth memory 41 stores the grayscale values for each pixel. Accordingly, the sixth memory 41 stores two-dimensional image information converted into charge levels. In this manner, basic data representing each color and each state of charge obtained when charging and discharging are performed in the equilibrium state is formed. This configuration enables output of a quantified reaction rate distribution of the lithium ion battery.

The above-described embodiments illustrate a configuration for display in grayscale using each charge level indicative of the degree of progress of charging and discharging or the quantity of charged electricity. Alternatively, the state of charge can also be used as a parameter indicative of the quantity of charged electricity. In this case, a state of charge converted into the state of charge from the corresponding hue scale value is displayed as an 8-bit grayscale. Accordingly, the color image is converted into a two-dimensional image represented by each state of charge.

Next, a line analysis of a color image will be described. A color image of a linear area designated along a predetermined direction is extracted from time-series two-dimensional color images stored in the first memory 32. Then, color image data on the linear area is arranged along the temporal axis and a 1-line analysis image is formed. Specifically, the temporal axis and the axis representing the position of an area designated along one line are displayed by a Cartesian coordinate system. In this case, a Cartesian coordinate system is formed, for example, assuming that the horizontal axis represents the temporal axis and the vertical axis represents the axis representing the position of a designated line. This enables display of a color change of a designated linear area as a two-dimensional image.

At the same time, the time-series states of charge stored in the fourth memory 37 are displayed in parallel on the same temporal axis. Such a display allows a color change in a linear area and a change in the state of charge to be displayed on the same temporal axis. This makes it possible to output the analysis data representing a change in the electrical characteristic of the battery and a change in the local reaction rate. In this line analysis, a 1-line analysis image between the current collectors is formed by setting the line to be displayed in the direction connecting the cathode and the anode. This enables detection of a reaction rate distribution in the inter-electrode direction.

The use of the 1-line analysis image in which color images corresponding to one line are arranged along the temporal axis enables measurement of a reaction rate distribution at a position on one line as a time difference. Specifically, the 1-line analysis image is displayed on the monitor, and a time required for shifting from Stage 2 to Stage 1, for example, is measured from the color of each pixel of the designated one line. This enables measurement of a time difference in local intercalation and measurement of a reaction rate distribution as temporal data.

In addition, the use of the 1-line analysis image enables measurement of a change in expansion and contraction of each active material layer. The 1-line analysis image is displayed as a Cartesian coordinate system assuming that the horizontal axis represents the temporal axis and the vertical axis represents the position in a designated direction. Accordingly, a change in expansion and contraction due to charging and discharging is measured by measuring the amount of change of the position in the vertical axis direction on the monitor. In this case, a cross-sectional image between the cathode current collector and the anode current collector is captured and a line is designated between the cathode current collector and the anode current collector, to thereby form a 1-line analysis image. Further, a change in expansion and contraction of each active material layer during charging and discharging can be measured by measuring a change in the distance between the current collectors. In this case, the display of the 1-line analysis image and the state of charge on the same temporal axis allows association between the change in electrical characteristics and the expansion and contraction between the current collectors. In other words, the relationships among a state of charge, an expansion ratio, and a contraction ratio can be obtained. Also, the relationships among a charge level, an expansion ratio, and a contraction ration can be obtained.

Figure 7A:
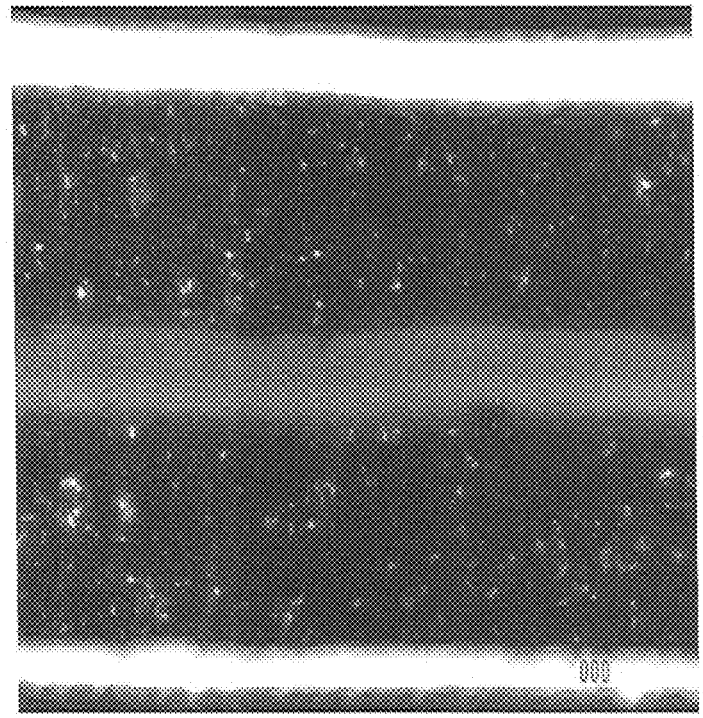
FIGS. 7A and 7B each show an example of a 1-line analysis image.
Figure 7B:
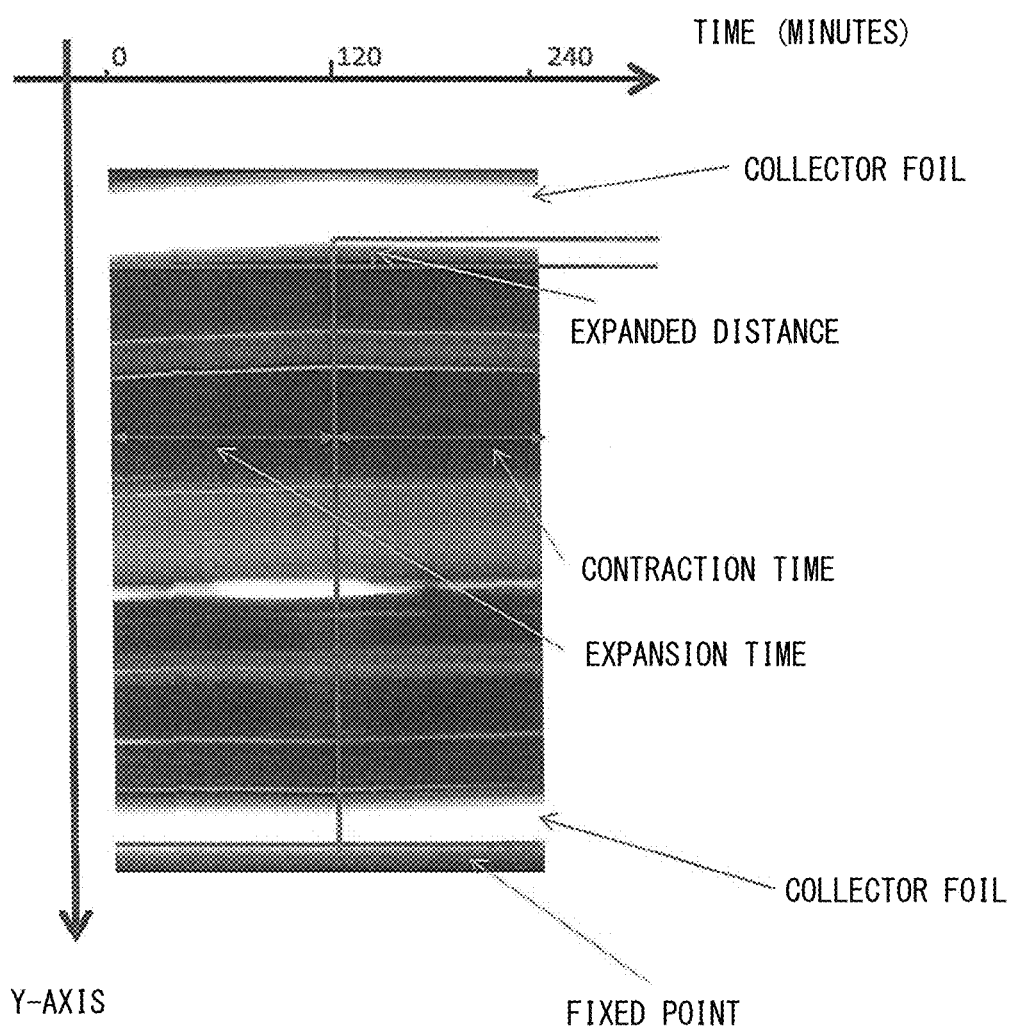

FIGS. 7A and 7B each show an example of the 1-line analysis image. FIG. 7A shows an omnifocal image between the anode current collector and the cathode current collector during charging and discharging, and FIG. 7B shows a 1-line analysis image. In FIG. 7B, the horizontal axis represents time and the vertical axis represents a position between an anode collector foil and a cathode collector foil. A two-dimensional color image is captured in such a manner that the cathode collector foil shown on the lower side is fixed and the anode collector foil shown on the upper side is supported so as to be displaceable. The display of the 1-line analysis image enables recognition of the expansion and contraction of the anode collector foil according to the elapsed time after charging is started. That is, the amount of expansion and the amount of contraction can be measured by measuring a change in the distance between the collector foils by using the 1-line analysis image. Alternatively, the amount of expansion and the amount of contraction can be measured by measuring a change in the distance between the collector foil and the separator by using the 1-line analysis image.

In the embodiments described above, the horizontal axis represents the temporal axis and the vertical axis represents a position coordinate in a line direction. Alternatively, a state of charge can be set as the horizontal axis, and a position coordinate in a line direction can be set as the vertical axis. In this case, a color charge at each position on a designated line corresponding to a change in the state of charge can be displayed as a two-dimensional image.

The analysis data formed according to the present invention is output through an output unit 42. The output unit 42 outputs the analysis data to the monitor 22, for example. The output unit 42 may output the analysis data to a printer, another personal computer, and the like. This enables display of various types of analysis data to be displayed on the monitor 22. The output unit 42 is connected with the input device 21 such as a keyboard or a mouse. The operator can designate desired analysis data through the input device 21. The analysis data to be output from the analysis apparatus according to the present invention will be described below.

[Color Image and Moving Image of Electrical Characteristics During Charging and Discharging]

When a moving image of a color image during charging and discharging is designated through the input device 21, the output unit 42 accesses the first memory 32 and extracts time-series color images. Further, the output unit 42 accesses the fourth memory 37 and extracts data representing the state of charge. Then, the output unit 42 temporally links the two extracted data items and outputs the extracted data to the monitor 22. The monitor 22 displays color image data on the moving image and the time-series data representing the state of charge in parallel. For example, the moving image of the color image can be displayed on the upper half of the monitor 22, and the time-series data on the state charge can be displayed on the lower half of the monitor 22. When dendrite is generated during the display of the moving image of the color image, the relationships among the generation of dendrite, the generation time, and the state of charge can be recognized. The output of the moving image of the color image enables display of the relationship between the occurrence of local overcharge (charge concentration) and the electrical characteristics in parallel. Specifically, when overcharge occurs due to the occurrence of local charge concentration, a golden region which glows strongly is generated in the color image. The relationship between the overcharge and the electrical characteristics can be recognized by outputting the moving image. Not only the color image and the state of charge, but also the moving image of the color image and the time-series data on the electrical characteristics including the state of charge and the charging and discharging voltage can be displayed in parallel.

[Three-Dimensional Image and Moving Image of Electrical Characteristics During Charging and Discharging]

When a moving image of a three-dimensional image during charging and discharging is designated through the input device 21, the output unit 41 accesses the second memory 34 and extracts time-series three-dimensional images. Further, the output unit 42 accesses the fourth memory 37 and extracts data representing the state of charge. Then, the output unit 42 temporally links the extracted two data items and outputs the linked data items to the monitor 22. The monitor 22 displays the three-dimensional image data on the moving image and the data representing the state of charge in parallel. For example, the moving image can be displayed on the upper side of the monitor screen, and time-series changes of the state of charge can be displayed on the lower side. The three-dimensional image is useful when dendrite is generated. The output of the moving image of the three-dimensional image enables display of a change in the three-dimensional direction of the generated dendrite in parallel with the electrical characteristic data. Furthermore, a local change in the height of the surface can also be detected during the display of the moving image of the three-dimensional image. In this case, a local change in the height can be measured by displaying a cross-sectional image obtained when the local change has occurred. The three-dimensional image can also be displayed in a stereoscopic manner (bird's eye view) as a moving image.

Moreover, the occurrence of a local volume change can be recognized from the moving image of the three-dimensional image. When overcharge occurs due to the local charge concentration, a local volume change occurs. Thus, the local volume change is detected from the moving image of the three-dimensional image, so that a region in which overcharge occurs due to the charge concentration is recognized. In this case, the moving image of the three-dimensional image and the time-series data on the electrical characteristics are displayed in parallel, which provides an advantageous effect that the relationships among the generation of overcharge, the state of charge, and the charging and discharging voltage can be recognized.

[Color Image, Three-Dimensional Image, and Moving Image of Electrical Characteristics]

In the analysis apparatus according to this embodiment, moving images of a color image and a three-dimensional image and a change in electrical characteristics can be output and displayed in parallel. Specifically, when moving images of a color image and a three-dimensional image during charging and discharging are designated through the input device 21, the output unit 42 accesses the first memory 32 and extracts time-series color images. Further, the output unit 42 accesses the second memory 34 and extracts time-series data on the three-dimensional image. Furthermore, the output unit 42 accesses the third memory 35 and the fourth memory 37, and extracts time-series data on the charging and discharging voltage and time-series data representing the state of charge. The output unit 42 temporally links the four extracted data items, and outputs two image data items and two electrical data items to the monitor 22. In this case, for example, the screen of the monitor 22 is divided into three parts in the vertical direction, and the moving images of the color image and the three-dimensional image are displayed in parallel. At the same time, the monitor 22 can display the state of change and a temporal change of the charging and discharging voltage. In this case, the generation of dendrite and the occurrence of overcharge can be recognized by the color image and the three-dimensional image. Furthermore, the corresponding electrical characteristic can also be recognized at the same time.

[Color Change]

When a color change in a specific area is designated as the analysis data, the output unit 42 accesses the first memory 32. Further, the output unit 42 extracts, from the first memory 32, color information on the area designated in the image from the time-series color image, and arranges the color information on the temporal axis. At the same time, the output unit 42 accesses the fourth memory 37 and extracts time-series states of charge. Then, the output unit 42 links the extracted color information and the states of charge on the same temporal axis, and outputs them to the monitor 22. In this case, a color change corresponding to a change in the state of charge is displayed along the temporal axis. This color change is useful when there is a need to recognize a color change in one active material during charging and discharging.

[Charge Level Distribution]

When an output of a charge level distribution is input as the designation information, the output unit 42 accesses the sixth memory 41 and extracts a charge level distribution which is converted into a grayscale. This allows the output unit 42 to output a two-dimensional image of the charge level distribution at the designated time or in the designated state of charge. The sixth memory 41 outputs the charge level distribution converted into the grayscale, thereby making it possible to recognize a local reaction rate distribution in various states of charge.

[1-Line Analysis Image]

When an output of a 1-line analysis image is designated, the output unit 42 accesses the first memory 32. Then, the output unit 42 extracts, from the first memory 32, a color image corresponding to one line designated from time-series color images, and arranges the extracted color image on the temporal axis. In this manner, the output unit 42 forms a 1-line analysis image. At the same time, the output unit 42 accesses the fourth memory 37 and extracts data representing time-series states of charge. The output unit 42 arranges the 1-line analysis image and the data representing the states of charge on the same temporal axis. Further, the output unit 42 outputs the analysis data in which the 1-line analysis image and the states of charge are arranged on the same temporal axis. The 1-line analysis image and the states of charge, which are arranged on the same temporal axis, are displayed on the monitor 22. This display enables recognition of a local color change on one line in a manner corresponding to the state of charge. It is also possible to output only the 1-line analysis image.

It is also possible to measure a reaction rate distribution from the 1-line analysis image. In this case, a time during which the color significantly changes, for example, a time required to change the color from red to gold, is measured. This enables measurement of a reaction rate distribution in the 1-line direction.

In the case of measuring a temporal change of the expansion and contraction from the 1-line analysis image, a reference line parallel to the temporal axis is drawn for the 1-line analysis image displayed on the monitor. The amount of change from the reference line can be directly measured as an expansion amount or a contraction amount.

[State of Charge and Color Image]

In the present invention, each state of charge and each color image are temporally linked, which enables output of the color image corresponding to the value of the state of charge. In this case, the output unit 42 accesses the fourth memory 37 and extracts the time when the designated value reaches the state of charge. Subsequently, the output unit 42 accesses the first memory 32, extracts the color image obtained at the extracted time, and outputs the extracted color image to the monitor 22. As a result, the color image corresponding to the state of charge can be displayed on the monitor.

It is also possible to designate a range of states of charge and output moving images of color images in the designated states of charge. For example, in the case of observing color images in states of charge of 50% to 100%, the color images in the range of states of charge can be output as a moving image. In this case, the states of charge of 50 to 100% are designated through the input device 21. Then, the output unit 42 accesses the fourth memory 37 and obtains information on the time when the state of charge reaches 50% and 100%. Subsequently, the output unit 42 accesses the first memory 32, extracts color images corresponding to the range of the obtained time information, and outputs the extracted color images to the monitor 22.

[Charging and Discharging Voltage and Color Image]

In the present invention, charging and discharging voltages and color images are temporally linked, which enables output of the color image corresponding to the value of the designated charging and discharging voltage. In this case, the output unit 42 accesses the third memory 35 and obtains information on the time when the designated charging and discharging voltage is reached. Subsequently, the output unit 42 accesses the first memory 32 and extracts the color image at the obtained time. The output unit 42 outputs the color image of the designated charging and discharging voltage to the monitor 22. Accordingly, the monitor 22 can display the color image at the time when the charging and discharging voltage changes stepwise. Also in this case, when two charging and discharging voltage values are designated, color images between the values can be output as a moving image.

[Elapsed Time after Start of Charging and Color Image]

Designation of an elapsed time after charging is started enables output of a color image at the time. In this case, the output unit 42 accesses the first memory 31 and extracts the color image at the designated time. Also as for the elapsed time after charging is started and the charge level, the output unit 42 extracts the charge level at the designated time. In this case, the output unit 42 accesses the fifth memory 40 and outputs the charge level image at the designated time. It is also possible to designate two times and output charge level images during the time period as a moving image.

The present invention is not limited to the above embodiments, but can be modified or changed in various manners. For example, the above embodiments illustrate a configuration in which a color image is captured by two-dimensionally scanning the surface of the secondary battery with illumination beams. Alternatively, a line confocal optical system can also be used. For example, a linear illumination beam is emitted from a light source device, and the linear illumination beam is periodically deflected in the direction orthogonal to the extending direction of the linear illumination beam by a galvanometer mirror or a vibration mirror. This configuration also enables scanning of the surface of the secondary battery. Specifically, white light emitted from a mercury lamp, for example, is converted into a linear illumination beam through a cylindrical lens and a slit. Then, the linear illumination beam is periodically deflected in the direction orthogonal to the line direction by a galvanometer mirror or the like. This makes it possible to form a two-dimensional image of the surface of the secondary battery.

While the lithium ion secondary battery has been described by way of example in the above embodiments, the present invention is also applicable to analysis of various types of secondary batteries such as a sodium ion secondary battery and a magnesium ion secondary battery. Furthermore, the present invention is applicable to image analysis of various types of materials whose color changes in multiple steps due to electrochemical reaction.

While color images of the lithium ion battery are captured and the color images and the charging and discharging data are linked in the above embodiments, monochromatic images may be captured. For example, monochromatic images are captured instead of color images. This can be applied to the case of linking monochromatic images of the secondary battery and the charging and discharging data. For example, in the case of measuring the expansion or contraction during charging and discharging of the secondary battery, the amount of expansion and contraction of the secondary battery can also be measured by using monochromatic images.

The analysis data described above is illustrative only, and analysis data is not limited to the analysis data described above. Various types of analysis data temporally linking a color image and an electrical characteristic can be output.

The whole or a part of the first to sixth memories may be physically the same memory. The whole or a part of the processes of the analysis method described above may be executed by a computer program. The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An apparatus for charging and discharging of a secondary battery by using a color image, the apparatus comprising:
    an observation cell that includes a transparent window and houses the secondary battery;
    a charging and discharging controller that controls charging and discharging of the secondary battery;
    a color image pickup device that projects illumination light toward the secondary battery through the transparent window from a direction parallel to an extending direction of a current collector and an active material layer of the secondary battery, captures a color image of a cross-section of the active material layer of the secondary battery in a direction from a cathode to an anode of the secondary battery through the transparent window, and outputs time-series color image data; and
    a signal processing device includes an output unit, including a monitor displaying the color image, that outputs, as analysis data, color image data in a moving image format, or two-dimensional color image data associated with an elapsed time of charging and discharging.

2. The analysis apparatus according to claim 1, wherein
    a color confocal image pickup device that captures a color confocal image of the secondary battery while changing a relative distance between an objective lens and the secondary battery is used as the color image pickup device,
    the signal processing device includes a unit that forms, from a color confocal image signal, a color omnifocal image in focus over substantially an entire image pickup area, and
    the output unit outputs the color omnifocal image as the color image data.

3. The analysis apparatus according to claim 1, wherein
    a color confocal image pickup device that captures a color confocal image of the secondary battery while changing a relative distance between an objective lens and the secondary battery is used as the color image pickup device,
    the color confocal image pickup device includes a distance sensor that detects the relative distance and outputs the relative distance as distance information to the signal processing device,
    the signal processing device further includes a three-dimensional image forming unit that sequentially forms, at a predetermined time interval, three-dimensional color images of an active material layer by using the distance information and the color confocal image signal, and
    the output unit outputs the three-dimensional color images as the color image data.

4. The analysis apparatus according to claim 1, wherein color image data in which dendrite is visually recognized is output.

5. The analysis apparatus according to claim 1, wherein the secondary battery has full-cell structure, and
wherein the full-cell structure includes
a cathode collector;
an anode collector;
a separator disposed between the cathode collector and the anode collector;
a cathode active material layer disposed between the cathode collector and the separator; and
an anode active material layer disposed between the anode collector and the separator.

6. The analysis apparatus according to claim 1, wherein the secondary battery has half-cell structure formed only of an anode, and
wherein the half-cell structure includes
a cathode collector;
an anode collector;
a separator disposed between the cathode collector and the anode collector;
a metallic foil disposed between the cathode collector and the separator; and
an anode active material layer disposed between the anode collector and the separator.

7. A method for charging and discharging of a secondary battery by using a color image, the method comprising:
charging and discharging the secondary battery under a predetermined condition by using a charging and discharging controller;
projecting illumination light toward the secondary battery through a transparent window, of an observation cell that includes the transparent window and houses the secondary battery, from a direction parallel to an extending direction of a current collector and an active material layer of the secondary battery, and capturing a color image of a cross-section of the active material layer of the secondary battery, in a direction from a cathode to an anode of the secondary battery through the transparent window, during charging and discharging and forming time-series color image data, by using a color image pickup device; and
outputting, by a monitor displaying the color image, as analysis data, color image data in a moving image format, or two-dimensional color image data associated with an elapsed time of charging and discharging.

8. The method according to claim 7, wherein the secondary battery has full-cell structure, and
wherein the full-cell structure includes
a cathode collector;
an anode collector;
a separator disposed between the cathode collector and the anode collector;
a cathode active material layer disposed between the cathode collector and the separator; and
an anode active material layer disposed between the anode collector and the separator.

9. The method according to claim 7, wherein the secondary battery has half-cell structure formed only of an anode, and
wherein the half-cell structure includes
a cathode collector;
an anode collector;
a separator disposed between the cathode collector and the anode collector;
a metallic foil disposed between the cathode collector and the separator; and
an anode active material layer disposed between the anode collector and the separator.

* * * * *